(12) United States Patent
Lemson

(10) Patent No.: US 7,649,363 B2
(45) Date of Patent: Jan. 19, 2010

(54) METHOD AND APPARATUS FOR A VOLTAGE/CURRENT PROBE TEST ARRANGEMENTS

(75) Inventor: Gary M. Lemson, Boulder Creek, CA (US)

(73) Assignee: Lam Research Corporation, Fremont, CA (US)

(*) Notice: Subject to any disclaimer, the term of this patent is extended or adjusted under 35 U.S.C. 154(b) by 376 days.

(21) Appl. No.: 11/770,636

(22) Filed: Jun. 28, 2007

(65) Prior Publication Data

US 2009/0066342 A1   Mar. 12, 2009

(51) Int. Cl.
*G01R 35/00* (2006.01)
(52) U.S. Cl. .................. 324/601; 324/633
(58) Field of Classification Search .......... 324/601, 324/633
See application file for complete search history.

(56) References Cited

U.S. PATENT DOCUMENTS

| | | |
|---|---|---|
| 6,781,393 B2 | 8/2004 | Benjamin |
| 6,972,579 B2 | 12/2005 | Benjamin |
| 7,086,347 B2 | 8/2006 | Howald et al. |
| 2005/0019961 A1 * | 1/2005 | Davis et al. ............... 438/7 |

OTHER PUBLICATIONS

"International Search Report", Issued in PCT Application No. PCT/US2008/068156; Mailing Date: Dec. 30, 2008.
"Written Opinion", Issued in PCT Application No. PCT/US2008/068156; Mailing Date: Dec. 30, 2008.

* cited by examiner

*Primary Examiner*—Vincent Q Nguyen
(74) *Attorney, Agent, or Firm*—IP Strategy Group, P.C.

(57) ABSTRACT

A diagnostic tool for performing electrical measurements to calibrate a plasma processing chamber probe is provided. The diagnostic tool includes an RF generator. The diagnostic tool also includes a first impedance circuit. The first impedance circuit is a voltage-load network, configured to deliver RF voltage outputs from the RF generator for voltage measurements when RF power from the RF generator is delivered to the first impedance circuit. The diagnostic tool further includes a second impedance circuit. The second impedance circuit is a current-load network, configured to deliver RF current outputs from the RF generator for current measurements when the RF power from the RF generator is delivered to the second impedance circuit. The diagnostic tool further includes a coaxial switch network arrangement configured to provide switchable RF delivery paths to deliver the RF power from the RF generator to one of the first impedance circuit and the second impedance circuit.

32 Claims, 9 Drawing Sheets

METHOD AND APPARATUS FOR A VOLTAGE/CURRENT PROBE TEST ARRANGEMENTS

BACKGROUND OF THE INVENTION

Advances in plasma processing have facilitated growth in the semiconductor industry. During plasma processing, diagnostic tools may be employed to ensure high yield of devices being processed. Radio frequency (RF) electrical measurements may be utilized as a diagnostic tool for monitor and/or control of plasma electrical properties to maintain tight control of process parameters during plasma processing.

During plasma processing, RF electrical measurements, e.g. voltage (V) and/or current (I), may be collected by a probe, e.g., TCP Kiyo V™ or TCP Kiyo 45 VI™ probe available from Lam Research Corp. of Fremont, Calif., for plasma diagnostic. The plasma diagnostic data from the probe may allow for determination of plasma potential, floating potential, electron density, and/or electron energy distribution function. However, accurate values for the plasma parameters may be difficult to determine because of the complexities involved in calibration and/or control of high RF voltage and/or current probe(s).

In order to calibrate a probe to measure high RF voltage and/or current, a high RF voltage and/or current test system with a high RF power generator is needed. A typical commercially available high power RF generator may deliver up to 500 volts at an accuracy of about 10 percent in a 50 Ohms system. However, the RF voltages being measured during plasma processing may exceed 6,000 volts peak with a minimum accuracy requirement of about 1.5 percent traceable back to a National Institute of Standards and Technology (NIST) standard. Thus, commercially available high power RF generators may not have the high RF power or the accuracy requirements for data collection employed by a probe for plasma diagnostic.

Referring to FIG. 1, a simplified schematic of a prior art RF delivery path 100 for the voltage test arrangement is shown. The RF power is supplied by a single air cooled 300 Watt generator 102, i.e. maximum output at 50 Ohms impedance, operating at about 13.56 MHz. The RF power output from generator 102 is routed by coaxial cables to a coaxial switch network 122.

As shown in FIG. 1, coaxial switch network 122 may be configured with a first switch (SW1) 104 and a second switch (SW2) 106. A 20 decibel (db) coaxial attenuator 110 is placed in the RF delivery path to enhance low power functionality by controlling SW1 104 and SW2 106. Attenuator 110 is employed to reduce power output from high RF power generator 102 to provide stability in the lower voltage test range.

For example, in the lower voltage range of about 200 to about 1,000 volts peak, SW1 104 and SW2 106 may be switched to select attenuator 110. For the higher voltage range of about 2,000 to beyond 6,000 volts peak, SW1 104 and SW2 106 may be switched to the high RF delivery path 108. In either case whether the attenuator is switched in or switched out, the power is routed to a V-load network 112.

In the example of FIG. 1, a position indicator 118 is coupled to SW1 104 and SW2 106. Position indicator 118 serves to monitor whether attenuator 110 has been selected to prevent hot switching. As the term is employed herein, hot switching refers to switching when there is output power coming out from the generator. Hot switching is not desirable during high RF power operations.

The signals coming from position indicator 118 are routed through control printed circuit board (PCB) 114. The signal conditions are read back over a data acquisition (DAQ) inputs/outputs (IO) 120 into a computer 116. Then the software algorithm in computer 116 interprets the signal conditions to determine whether to proceed or halt the test depending on whether the switches are selected correctly.

In general, commercially available high power RF generator 102 operates at about 50 Ohms with 300 watts of power. When operating a 50 Ohms system, enormous amounts of power, is needed to attain the desired high RF voltages, e.g. 10 kilowatts for 1000 volts peak to 360 kilowatts for 6,000 volts peak. In order for standard off-the-shelf RF generators to work, the RF generator may be integrated into a high impedance circuit to generate the higher voltages necessary for calibration of the probes. V-load network 112 is an example of a high impedance circuit that is tuned to deliver the required voltage range.

FIG. 2 shows a simplified schematic of a prior art voltage load network arrangement 200. In the example of FIG. 2, RF power is supplied by a 50 Ohms RF generator 202. The RF power signal is passed through a high impedance matched V-load network circuit 212 to generate high voltages necessary for plasma applications.

V-load network circuit 212 is configured with a first variable capacitor (C1) 204, a second variable capacitor (C2) 206, a third variable capacitor (C3) 208, and an inductor 210. The V-load network 212 is tuned to resonate at about 13.56 MHz. In this resonant system, the impedance needs to be matched between generator 202 and an output 216. Otherwise, generator 202 may run in an unstable condition and possibly shut down. With the input impedance from RF generator 202 of 50 Ohms, output 216 from V-load network circuit 212 is tuned to match the impedance of a probe 218 and a V-ref 214. The V-ref output signal 214 is sent to an RF voltmeter (RFVM) 215. Hence, in a matched network, the high impedance allows very high voltages to be sustained at output node 216. However, in order to calibrate probe 218, the high voltage output needs to have better accuracy than the capability of off-the-shelf measurements. For example, plasma applications require the measurement accuracy to be within about 1.5 percent over the range of high RF voltages being measured.

Referring to FIG. 3, a simplified schematic of a prior art RF voltage control arrangement 300 is shown. In the example of FIG. 3, a software algorithm in a computer 316 may send a command to a data acquisition board (DAQ) 320 to output an analog signal to drive a software-defined set point 324 to a high power RF generator 302. Hence, set point 324 may instruct generator 302 how much power to output.

The power signal output from generator 302 is routed through a switched network 322 to a V-load network 312. From V-load network 312, the signal, V-ref output 314, is measured. The V-ref-output signal 314 is sent to an RF voltmeter (RFVM) 315. The signal from RFVM 315 is sent as data to a general-purpose interface bus (GPIB) 318 and is read by computer 316.

In aforementioned closed-loop RF voltage control arrangement, data from GPIB 318 is compared with software-defined set point 324. For example, if a voltage at the V-load network 312 of 200 volts peak is desired, a software-defined set point 324 of 200 volts peak may be set. In a closed-loop control, for example, the voltage value from the data coming back over GPIB 318 may be compared to generate the control signal, DAQ 320, going back to RF generator 302. The process may be iterated through a control loop algorithm to achieve a V-ref output within the desired accuracy, e.g., 1.5 percent, of software-defined set point 324.

Unfortunately, the aforementioned prior arts suffer from a few deficiencies. In the case of commercially available RF generator, the voltages are in the ranges of up to about 500 volts peak. The 500 volts peak range is not high enough for the plasma applications. In addition, the voltage measurement accuracy of about 10 percent from commercially available RF generators may be inadequate. In the case where commercially available RF generator has been integrated into a V-load network, the voltage range and accuracy are within acceptable limits for plasma application. However, the high RF voltage test system does not have RF current measurement capabilities. Therefore, only voltage probe may be calibrated by the prior art high RF voltage test system.

SUMMARY OF INVENTION

The invention relates, in an embodiment, to a diagnostic tool for performing electrical measurements to calibrate a plasma processing chamber probe. The diagnostic tool includes an RF generator. The diagnostic tool also includes a first impedance circuit. The first impedance circuit is a voltage-load network, configured to deliver RF voltage outputs from the RF generator for voltage measurements when RF power from the RF generator is delivered to the first impedance circuit, wherein the RF voltage outputs are in the range of about 200 volts peak to about 6,100 volts peak. The diagnostic tool further includes a second impedance circuit. The second impedance circuit is a current-load network, configured to deliver RF current outputs from the RF generator for current measurements when the RF power from the RF generator is delivered to the second impedance circuit, wherein the RF current outputs are in the range of about 2 amperes to about 50 amperes. The diagnostic tool yet further includes a coaxial switch network arrangement configured to provide switchable RF delivery paths to deliver the RF power from the RF generator to one of the first impedance circuit and the second impedance circuit.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
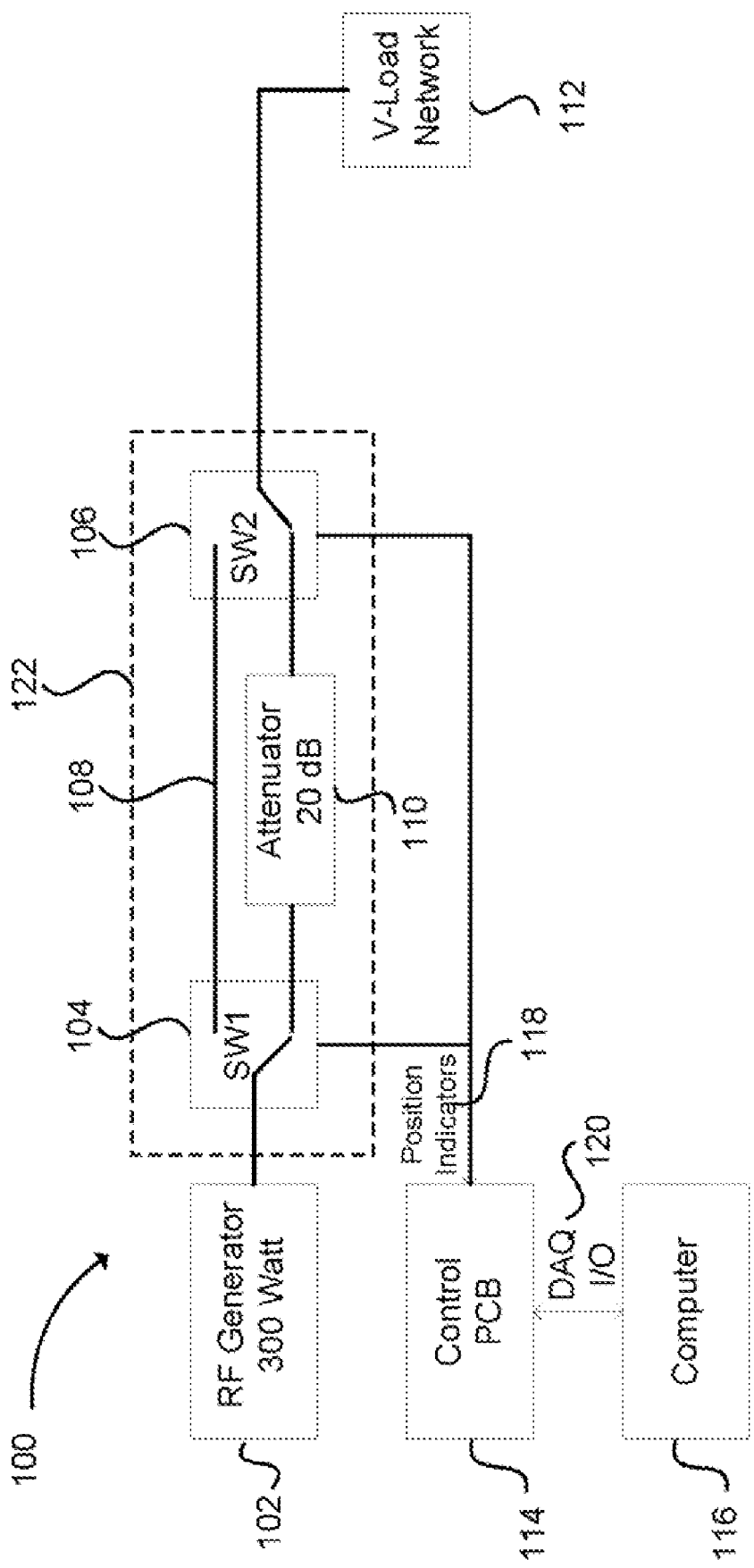
FIG. 1 illustrates a simplified schematic of a prior art RF delivery path for the voltage test arrangement.
Figure 2:
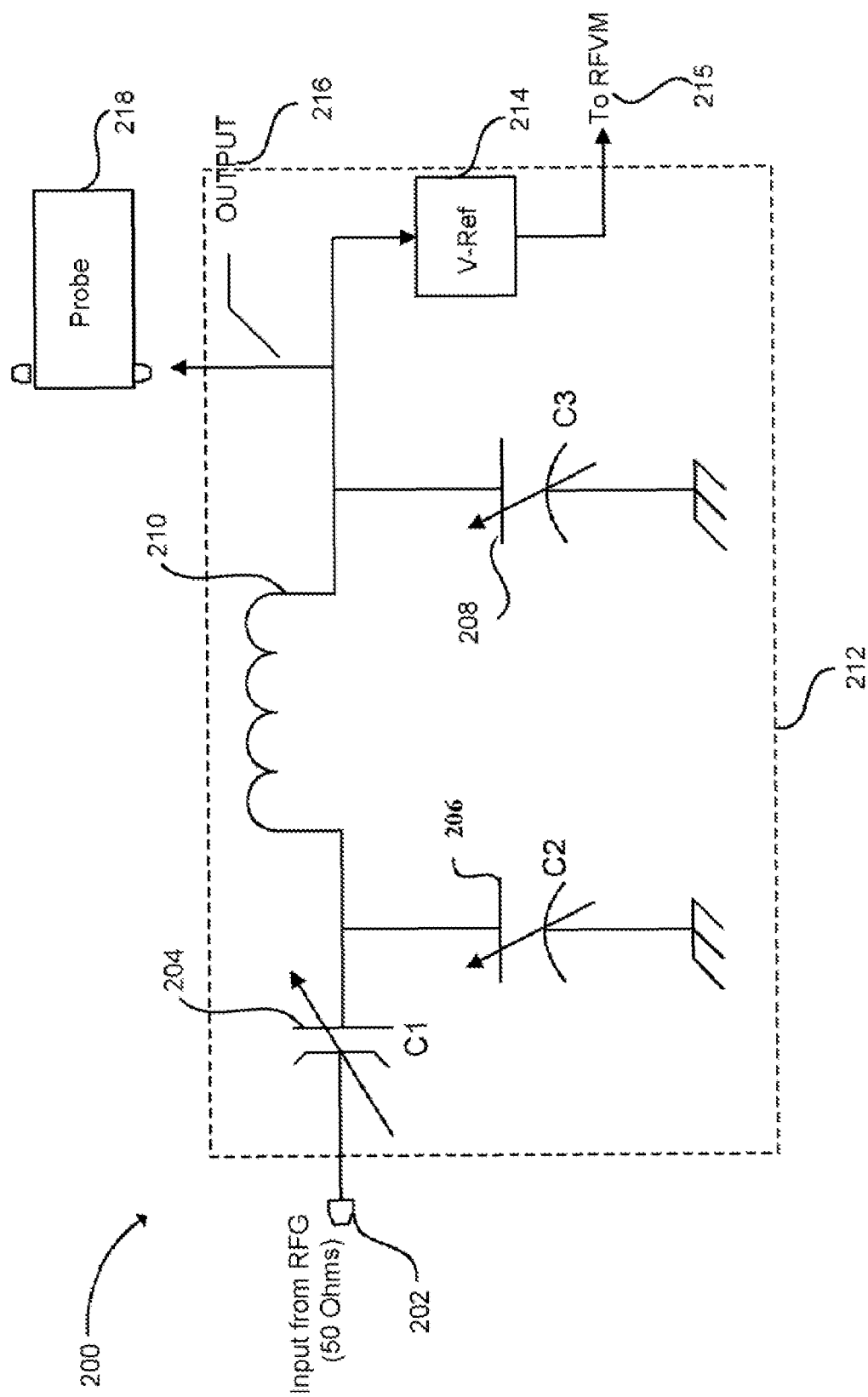
FIG. 2 illustrates a simplified schematic of a prior art voltage load network arrangement.
Figure 3:
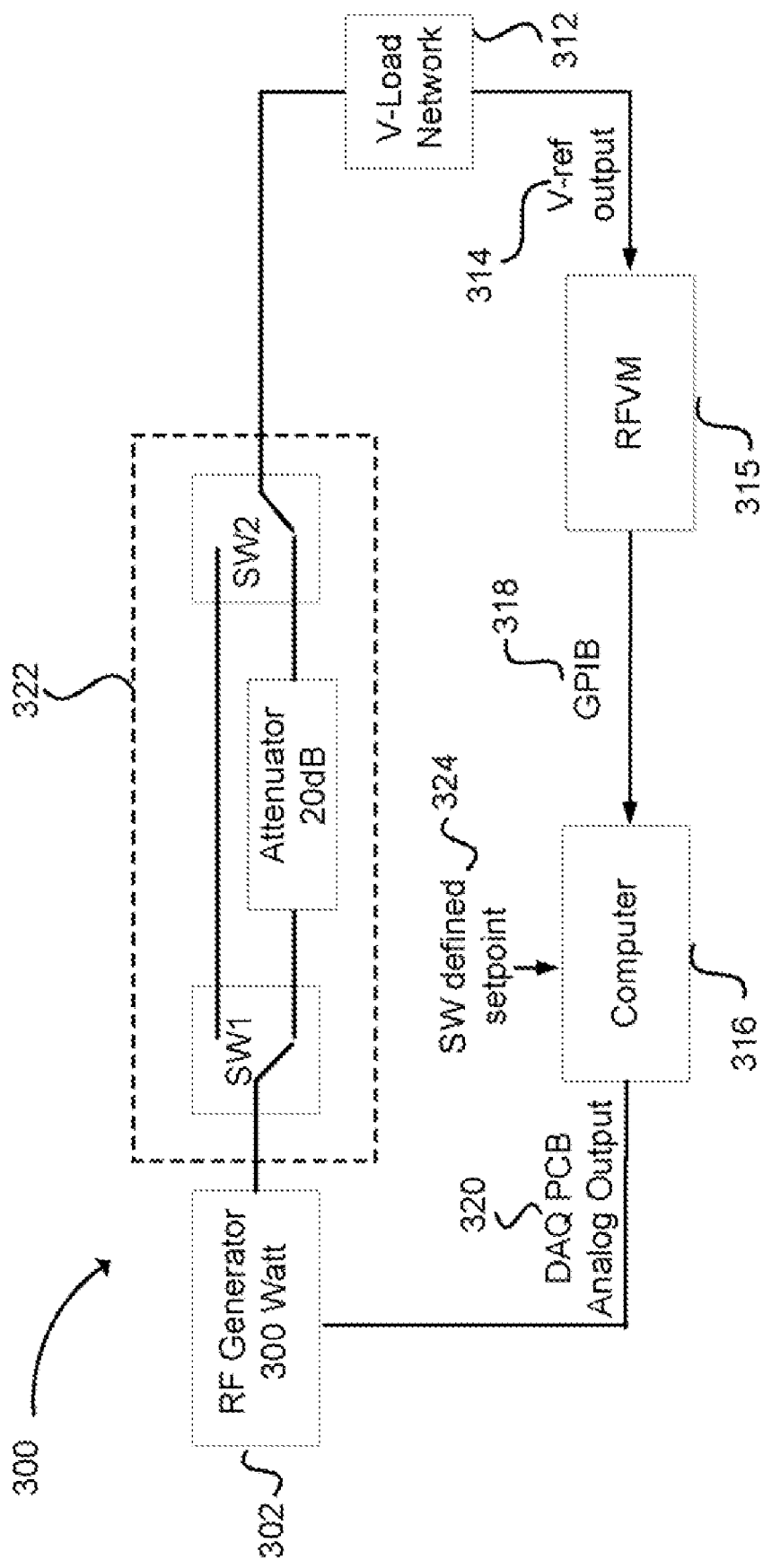
FIG. 3 illustrates a simplified schematic of a prior art RF voltage control arrangement.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the invention, there are provided methods and arrangements for a diagnostic tool to perform electrical measurements of high potential RF voltages and currents to calibrate probes for plasma applications. Embodiments of the invention include integrating a commercially available RF generator with a high impedance circuit to produce high peak voltages, which may be used to calibrate voltage and/or current probes. RF electrical measurements attained from the calibrated probes may be utilized for monitor and/or control of plasma electrical properties to maintain tight control of process parameters during plasma processing.

In one or more embodiments of the invention, a diagnostic tool, e.g., a voltage-current test arrangement, may be configured with a coaxial switch network to route high RF power output from a commercially available 50 Ohms generator to an I-load or V-load network. In an embodiment, coaxial switch network may be configured with a coaxial attenuator to reduce power output from high RF power generator to provide stable measurements at lower voltages. In an embodiment, the selection of low or high RF power may be controlled through a set of first or second switches. In another embodiment, RF power may be selectively routed to either an I-load network or a V-load network through a third switch. In accordance with an embodiment of the invention, the signal conditions and switch positions are sensed and controlled by a software algorithm in a computer. Thus, high potential RF voltages may be monitored and controlled to ensure proper delivery of high power RF signals to the selected network in a safe manner.

In one or more embodiments of the invention, a current-load network is employed to provide a high impedance circuit in a matched network to enable commercially available generator to deliver high potential RF voltages. In an embodiment, the current-load network is configured as a tuned resonant system to match with the impedance of the RF generator and output signals. Hence, in a matched network, I-load network with high impedance may allow very high currents to be sustained and delivered from a commercially available 50 Ohms RF generator.

In an embodiment an RF voltage control arrangement may be employed to command an RF generator to output RF power to match a predetermined software defined set point. In an embodiment, a closed-loop software control algorithm may be employed to iterate until the output voltage from either the I-load network or the V-load network is matched to the software-defined set point with about 1.5 percent accuracy. Accurate current and/or voltage measurements are critical for the calibration of V-probe and/or VI-probe to enhance process control during plasma processing.

In an embodiment, a control PCB interlock relay may be employed to enable or disable high RF power generator under predetermined conditions such as a water leak, exposed V-load or I-load RF voltages, or lack of cooling water supply flowing to I-load. Thus, the PCB interlock relay may prevent a user from being exposed to high RF voltage if any of the predetermined conditions are met.

In an embodiment, a control PCB probe signal routing may be employed to allow the signals to be routed through either an I-load or V-load to measure the current or voltage values from the two different probes.

Figure 4:
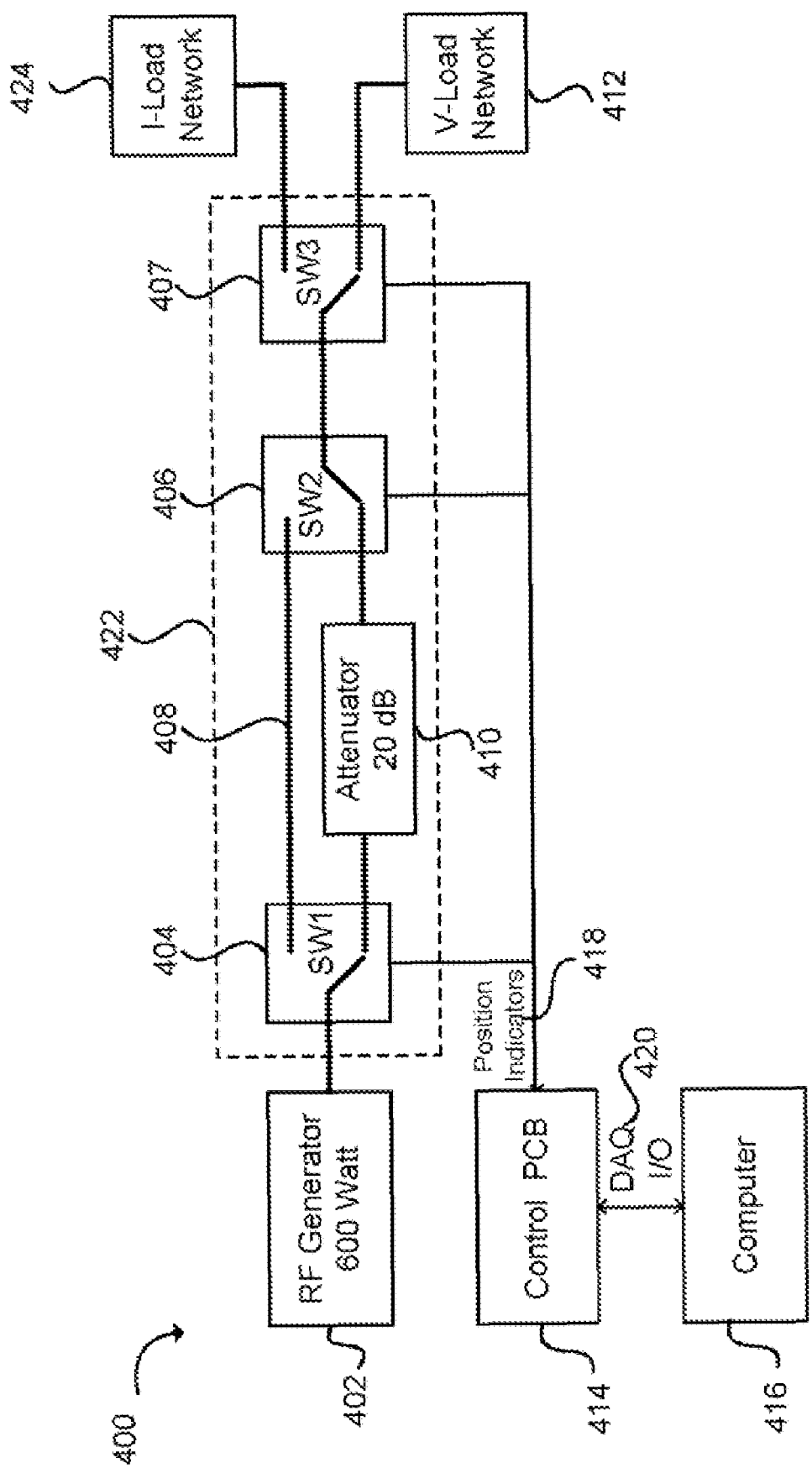
FIG. 4 illustrates in accordance with an embodiment of the present invention, a simplified schematic of an RF delivery path for the voltage-current (VI) test arrangement.

The features aid advantages of the invention may be better understood with reference to the figures and discussions that follow. FIG. 4 shows, in accordance with an embodiment of the present invention, a simplified schematic of an RF delivery path for the voltage-current (VI) test arrangement 400.

The RF power is supplied by a single air-cooled 600 Watt generator 402, i.e. maximum output at 50 Ohms impedance, operating at about 13.56 MHz. The RF power output from generator 402 may be routed by coaxial cables to a coaxial switch network 422.

In the implementation of FIG. 4, coaxial switch network 422 may be configured with a first switch (SW1) 404, a second switch (SW2) 406 and a third switch (SW3) 407. A 20 decibel (dB) coaxial attenuator 410 is placed in the RF delivery path to enhance low power functionality by controlling SW1 and/or SW2. Attenuator 410 may be employed to reduce power output from high RF power generator 402 to provide stability in the lower voltage test points.

For example, in the lower voltage range of about 200 to 1,000 volts peak, SW1 404 and/or SW2 406 may be switched to select attenuator 410. For the higher voltage range of about 2,000 to beyond 6,000 volts peak. SW1 404 and/or SW2 406 may be switched to the high RF delivery path 408. In either case whether the attenuator is switched in or switched out, the power is routed to SW3 407 in an embodiment. Third switch (SW3) 407 may be employed to allow for routing the power to either a V-load network 412 or an I-load network 424 in accordance with an embodiment of the invention.

In the implementation of FIG. 4, a position indicator 418 may be coupled to SW1 404, SW2 406 and/or SW3 407. Position indicator 418 serves to monitor whether attenuator 410 has been selected to prevent hot switching and/or whether V-load network 412 or I-load network 424 has been selected. During high RF voltage operation, hot switching is not desirable.

The signals coming from position indicators 418 may be routed through control PCB 414. The signal conditions are read back over a data acquisition (DAQ) input/output (I/O) 420 into a computer 416. Then the software algorithm in computer 416 interprets the signal conditions to determine whether to proceed or halt the test depending on whether the switches are selected correctly.

The aforementioned V-load network 412 is configured in a matched network with a high impedance circuit to enable commercially available RF generator 402 to deliver high RF voltage outputs. In contrast to prior art, RF delivery path, in the implementation of FIG. 4, is configured with I-load network 424 in addition to V-load network 412 and the appropriate switch, SW3 407. The I-load network 424 may be employed to increase the capability of the diagnostic tool by enabling current (I) measurements in high RF power applications.

Figure 5:
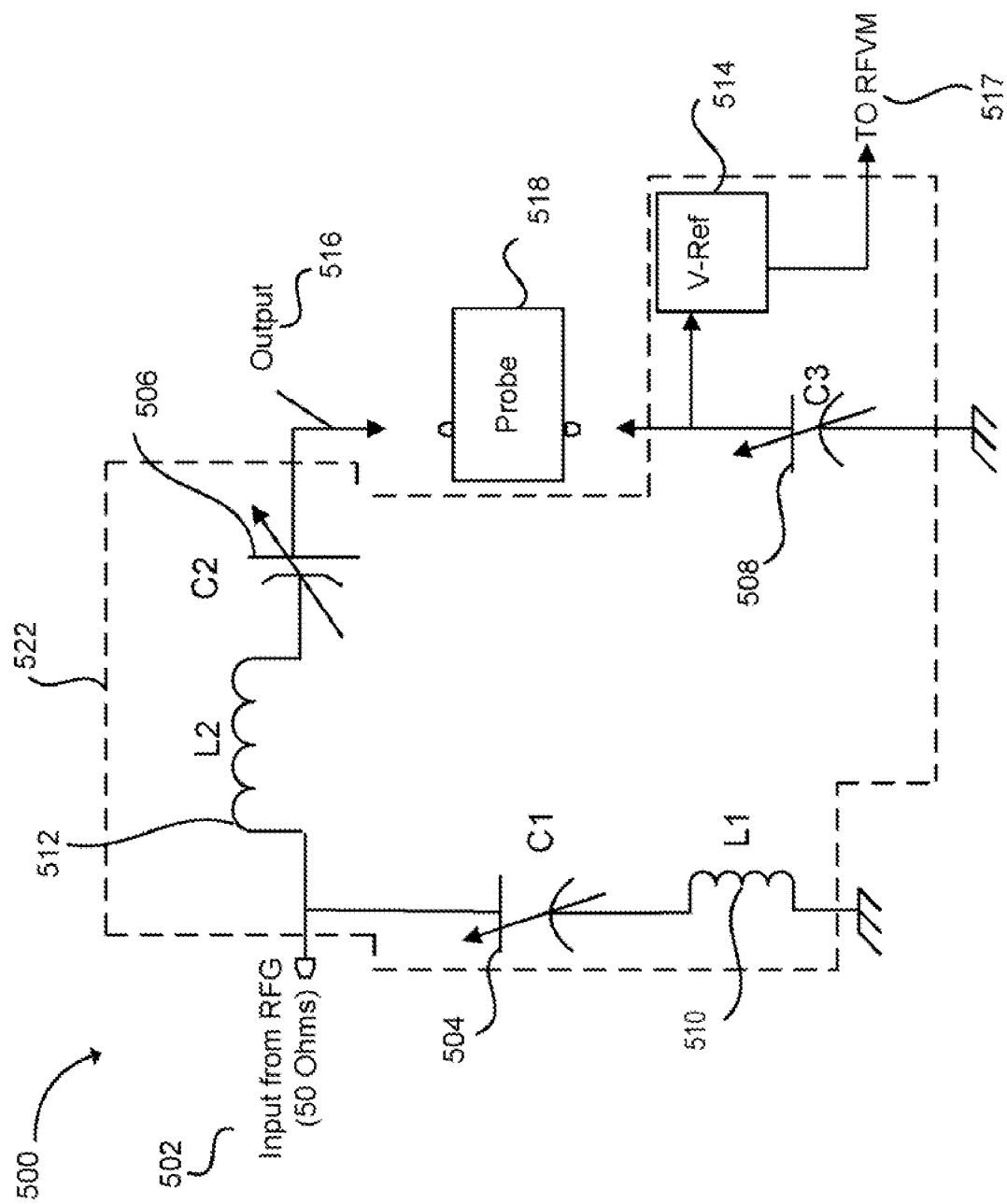
FIG. 5 illustrates in accordance with an embodiment of the invention, shows a simplified schematic of a current load network arrangement.

FIG. 5, in accordance with an embodiment of the invention, shows a simplified schematic of a current load network arrangement 500. In the example of FIG. 5, RF power is supplied by a 50 Ohms RF generator 502. An RF power signal may be passed through a high impedance matched I-load network circuit 522 to generate high currents, for example from about 2 amperes to about 50 amperes, necessary for plasma applications, e.g., probe calibration.

I-load network circuit 522 may be configured with a first variable capacitor (C1) 504, a second variable capacitor (C2) 506, a third variable capacitor (C3) 508, a first inductor (L1) 510, and a second inductor (L2) 512. I-load network 522 may be tuned to resonate at about 13.56 MHz. In aforementioned resonant system, the impedance may need to be matched between generator 502 and output 516 otherwise generator 502 may run in an unstable condition and possibly shut down. With the input impedance from RF generator 502 of 50 Ohms, an output 516 from I-load network circuit 522 may be tuned to match a probe 518, C3 508 and V-ref 514 impedance. The V-ref 514 output signal is sent to an RF voltmeter (RFVM) 517.

Since the V-ref 514, probe 518, and C3 508 are the defined load, the impedance (Z) of the defined load may be determined by measuring the voltage at C3 508. Knowing the impedance, the current may be calculated for a given voltage set point through the current path from output 516 through probe 518 to V-ref 514. The current may be calculated through the simple relationship of the voltage from V-ref 514 divided by the impedance (Z).

The impedance of the defined load may be matched by adjusting variable capacitors C1 (504) and C2 (506) of I-load network 522. The tuned network may be matched to resonate with RF generator 502 impedance at 50 Ohms. Hence, when resonated, a matched network allows very high currents, e.g., from about 2 amperes to about 50 amperes, to be sustained at output node 516 for plasma applications, e.g., current (I) probe calibration.

Figure 6:
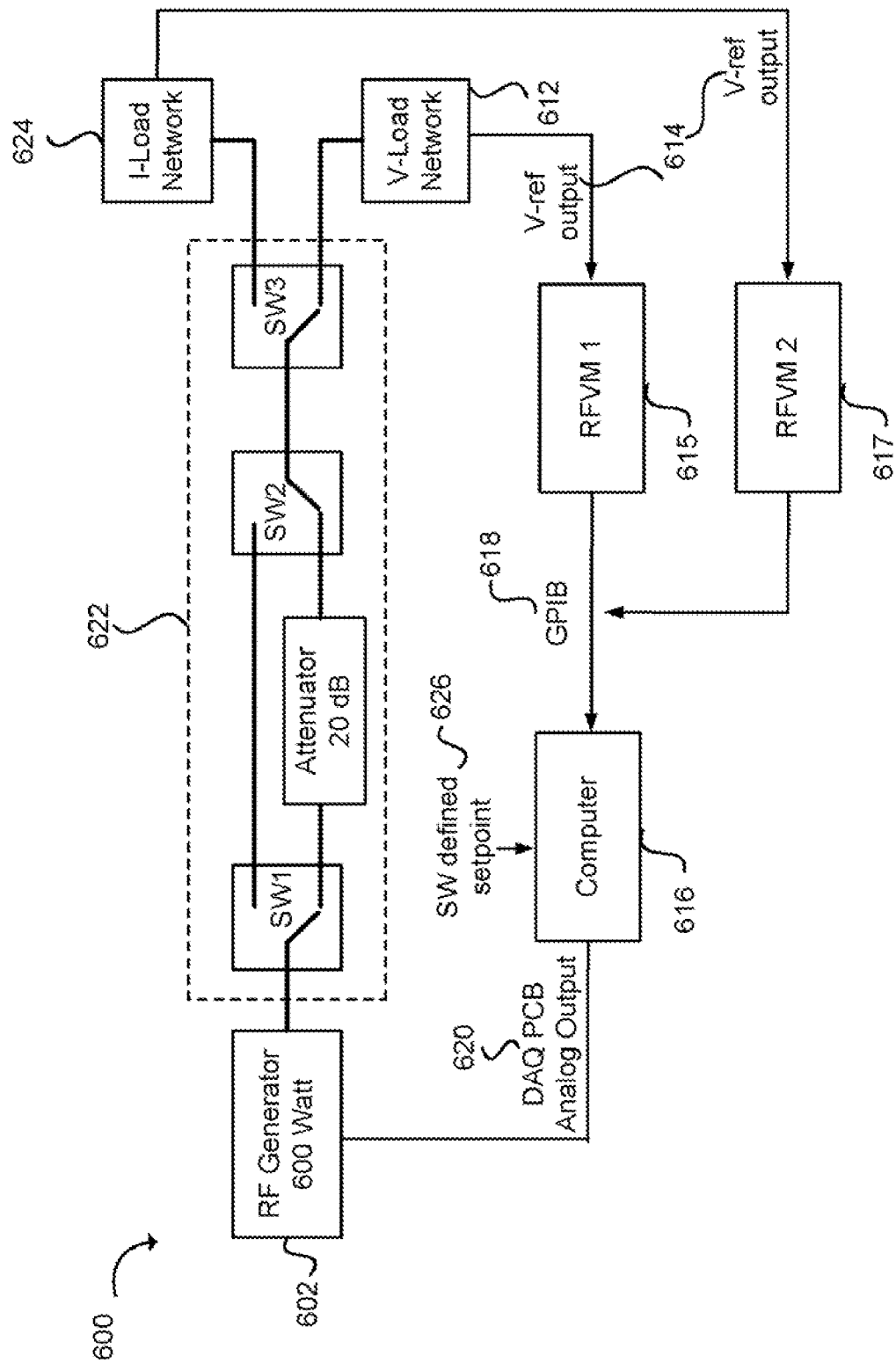
FIG. 6 illustrates in accordance with an embodiment of the invention, shows a simplified schematic of an RF voltage-control signal-flow arrangement.

FIG. 6, in accordance with an embodiment of the invention, shows a simplified schematic of an RF voltage-control signal-flow arrangement 600. In the implementation of FIG. 6, a software algorithm in a computer 616 may send a command to a data acquisition board (DAQ) 620 to output an analog signal to drive a set point 626 to a high power RF generator 602. Set point 626 tells generator 602 how much power to output.

In an embodiment, the power signal output from generator 602 may be routed through a switched network 622 to either a V-load network 612 or an I-load network 624 depending on the desired application. Consider the situation wherein, for example, the power signal may be routed to V-load network

612. From V-load network 612, the signal, V-ref output 614, is measured. The V-ref output signal 614 may be sent to an RFVM1 615. The signal from RFVM1 615 may be sent as data to a general-purpose interface bus (GPIB) 618 and may be read by computer 616.

In another example, the power signal may be routed to I-load network 624 in accordance with an embodiment of the invention. From I-load network 624, the signal, V-ref output 614, is measured. The V-ref output signal 614 may be sent to an RFVM2 617. The signal from RFVM2 617 may be sent as data to GPIB 618 and may be read by computer 616.

In the closed-loop RF voltage control arrangement, data from GPIB 618 may be compared with software-defined set point 626. For example, if a voltage at the V-load network 612 of 200 volts peak is desired, a software-defined set point 624 of 200 volts peak may be set. Through the closed-loop control, the voltage value from the data coming back over GPIB 618 may be compared to generate the control signal, DAQ 620, going back to RF generator 602. The process may be iterated through a control loop algorithm to achieve a V-ref output 614 within the desired accuracy, e.g., 1.5 percent, of software-defined set point 624. Analogously, the closed-loop control may be iterated for I-load network 624 to achieve a V-ref output 614 within the desired accuracy, e.g., 1.5 percent, of software-defined set point 624 in accordance with an embodiment of the invention. In an embodiment, the aforementioned method establishes an accurate, single parameter, i.e., voltage, closed-loop control.

Figure 7:
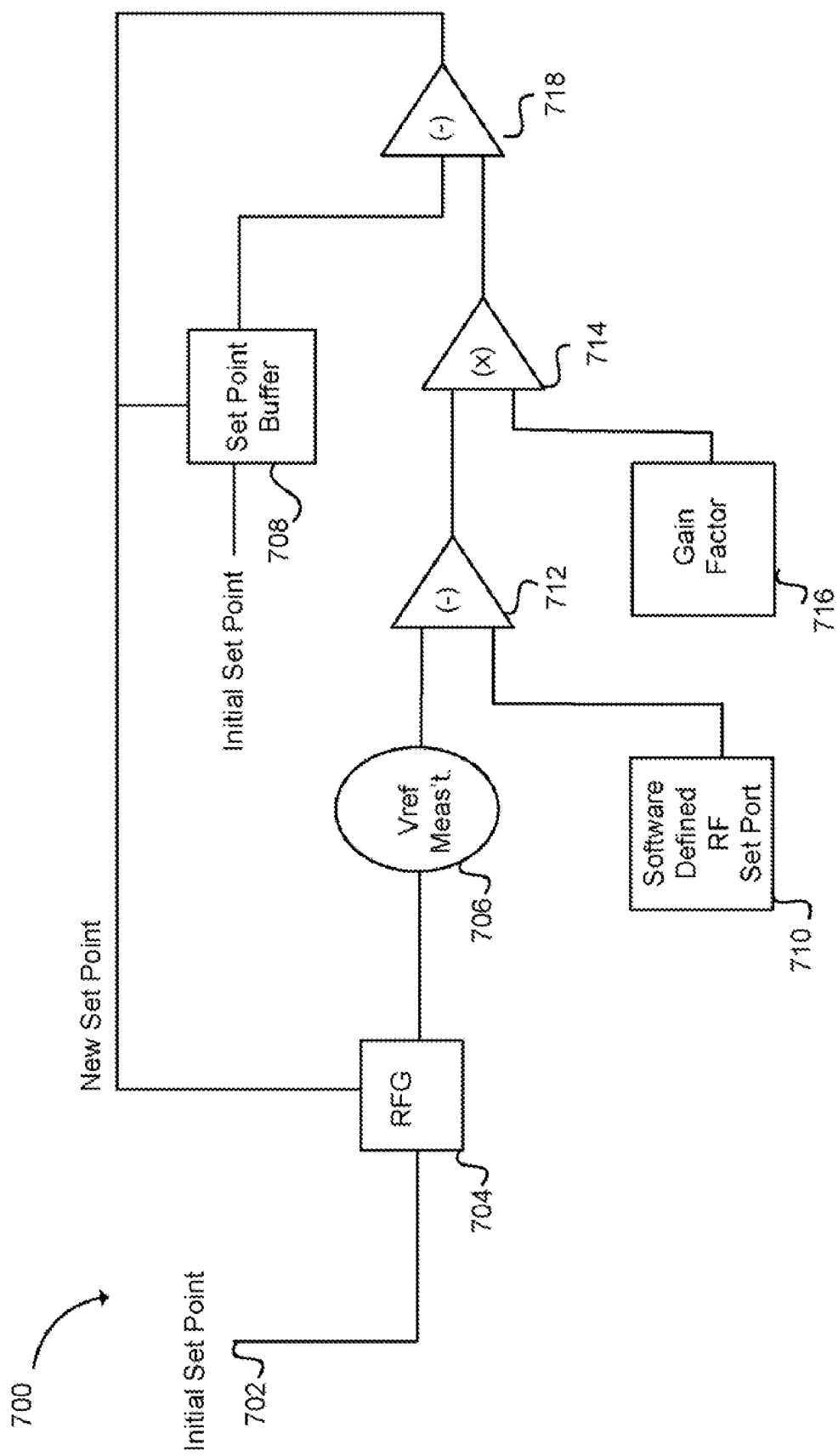
FIG. 7 illustrates in accordance with an embodiment of the invention, a flow diagram of a control loop algorithm in block diagram form for sustaining stable RF voltages.

FIG. 7 shows, in accordance with an embodiment of the invention, a flow diagram of a control loop algorithm 700 in block diagram form for sustaining stable RF voltages. In the implementation of FIG. 7, an initial set point 702 is sent to an RF generator 704 and a set point buffer 708. Set point 708 may be a memory or register location in a computer (not shown).

Upon acquiring V-ref measurement 706 from the voltage load, the software defined RF set point 710 may be subtracted from V-ref measurement 706 in step (712) in accordance with an embodiment. In the next step (714), the result from step (712) may be multiplied by a gain factor 716. Then in step (718), the result from step 714 may be subtracted from set point loaded into butler 708. The result from step (718) may be sent to set point buffer 708 and RF generator 704.

The process may be iterated in a closed-loop control until the desired set point is reached, i.e., software defined RF set point 710. Control loop algorithm 700 is able to provide accurate voltage control within 1.5 percent traceable back to NIST standards. Since RF current values may be calculated from known impedance and accurate voltage values. RF current values may also be controlled to about 1.5 percent traceable back to NIST standards in accordance with an embodiment.

Figure 8:
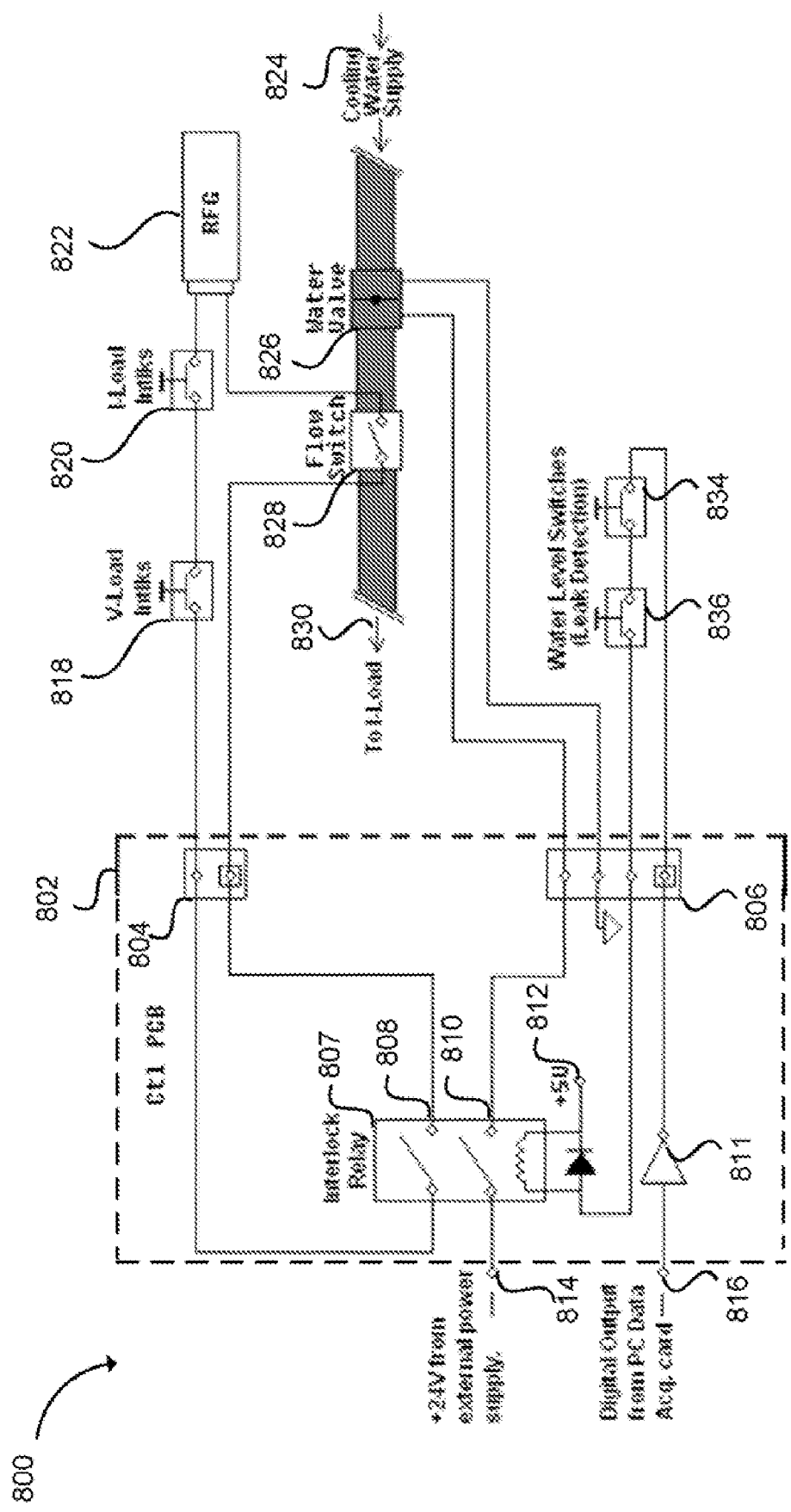
FIG. 8 illustrates in accordance with an embodiment of the invention, a simplified schematic of a system interlock for a voltage-current (VI) test fixture.

FIG. 8 shows, in accordance with an embodiment of the invention, a simplified schematic of a system interlock 800 for a voltage-current (VI) test fixture. In the implementation of FIG. 8, control PCB 802 may be configured with a first set of connectors 804, second set of connectors 806, an interlock relay 807, a first interlock relay switch 808, a second interlock relay switch 810, a voltage clamp circuit 812, a darlington circuit 811, a 24 volt external power supply 814, and an output from the personal computer (PC) data acquisition card (DAQ) 816 in an embodiment. Control PCB 802 is configured to provide a method of enabling and/or disabling high RF power generator 822 under predetermined conditions for safe operations in accordance with an embodiment of the invention.

As the term is employed herein, safe operations are conditions in which it is safe for the equipment to operate and/or safe for the operator to operate the equipment. In the implementation of FIG. 8, both high RF power operations and/or water-cooling may be employed in an embodiment. To ensure operators are not exposed to high RF power, a V-load interlock switch 818 and/or an I-load interlock switch 820 may be employed. Both V-load interlock switch 818 and/or I-load interlock switch 820 may be located under the hardware cover.

In addition to the hardware interlocks, a water cooling supply 824 may be employed to cool a high RF powered I-load system 830 by opening a water valve 826 and activating a flow switch 828. Since I-load system 830 may be water cooled, a system for detection of water leaks and water flow may be employed. The power from RF generator 822 may be disabled unless predetermined conditions for the safety interlock system are satisfied. In the implementation of FIG. 8, the predetermined conditions may require the hardware interlocks to be engaged, there are no leaks detected, and water-cooling is enabled for control PCB 802 to allow high RF power from generator 822 to be activated.

Consider the situation wherein, for example, the water level switches, e.g., a first water level switch 834 and a second water level switch 836, are part of the signal enable path to the interlock relay for leak detection. A signal, which may be derived from PC DAQ 816, may be sent out from control PCB 802. The enable signal may be routed through darlington circuit 811, which is a relay driver, and connector 806 to first water level switch 834 and second water level switch 836 back to PCB interlock relay 802 through connector 806. If the two water level switches 834 and 836 are closed, the signal may be enabled by voltage clamp circuit 812 to allow for control of the switches 808 and 810 within interlock relay 807.

Upon enabling interlock relay 807, 24 volts power may be routed through closed switch 810 and connector 806 to water valve 826. Then water valve 826 is opened to allow cooling water supply 824 to flow closing flow switch 828. When water valve 826 is opened, cooling water supply 824 may flow through to provide water-cooling to I-load system 830.

When flow switch circuit 828 is closed, RF generator 822 may send high RF power to the system if the I-load interlock 820 and V-load interlock 818 are both closed. Hence, control PCB 802 only allows high RF power flow if all the predetermined conditions, i.e., no water leaks, water valve is opened, flow switch is closed, and hardware interlocks are closed, are met. Thus, a user may be protected from being exposed to hazards associated with operating high RF power equipment.

Figure 9:
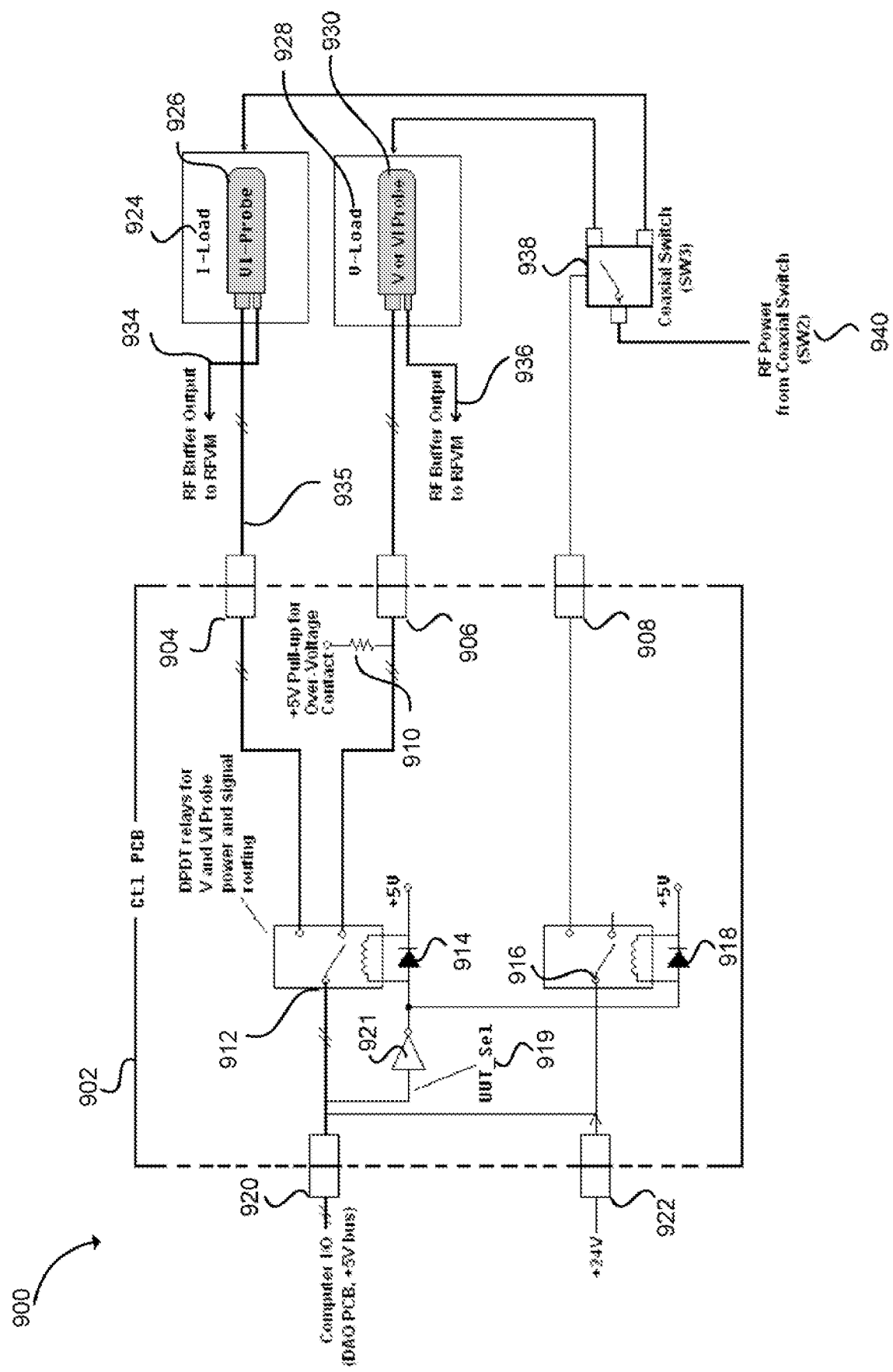
FIG. 9 illustrates in accordance with an embodiment of the invention, a simplified schematic of a probe signal routing arrangement.

FIG. 9 shows, in accordance with an embodiment of the invention, a simplified schematic of a probe signal routing arrangement 900. In the implementation of FIG. 9, a control PCB 902 is configured with a first connector 904, a second connector 906, a third connector 908, a probe contact detector 910, a first single-pole double-throw (SPDT) relay 912, a second SPDT relay 916, a first voltage clamp circuit 914, a second voltage clamp circuit 918, a UUT_select 919, a computer input/output (I/O) 920, and a 24 volts power supply 922.

Consider the situation wherein, for example, calibration of a probe is needed to be performed. In the prior art the voltage test arrangement has only a V-load network. Hence, a V-probe may only be calibrated for voltages. In contrast, the voltage-current test arrangement of the invention is configured with both a V-load network 924 and an I-load network 928 in accordance with an embodiment of the invention. Voltage-current test arrangement may be employed to calibrate VI-probe for both voltages and/or currents. Hence, the signal from VI-probe 926 and/or V or VI probe 930 needs to be routed to the appropriate channel via control PCB 902 in accordance with an embodiment.

For example, a user may want to measure a voltage signal from V-load 928 for either a V-probe 928 or a VI-probe 930. Either probe, i.e., V-probe or VI-probe, may be measured since both probes have voltage measurement capability. As shown in the implementation of FIG. 9, first SPDT relay 912, second SPDT relay 916, and/or a coaxial switch SW3 938 are in the default positions for V-load measurement 928. In general, SPDT relay allows for processing of multiple signals. However, other relay, e.g., double-pole double-throw (DPDT) may also be employed.

In an example, a UUT_select enable signal 919, which may be derived from computer I/O 920, may be routed to first SPDT relay 912 with first voltage clamp circuit 914 and second SPDT relay 916 with second voltage clamp circuit 918. In the implementation of FIG. 9, SPDT relays 912 and 916 are in the default positions for V-load measurement. Voltage clamp circuits 914 and 918 are configured to protect darlington driver 921 from high voltage spike damages. The high voltage spike may be directed to the +5V power supply derived from computer IO 920 to prevent spike damages. In addition, contact detector 910 may be configured in the V-load signal path to sense over-voltage contact position in either the V-probe or VI-probe.

In general, V-probe and/or VI-probe are two probes being tested and calibrated for plasma applications. Each probe may have uniquely discreet signals being tested. For example, Vpk_Pos is a peak positive voltage available on both V-probe and/or VI-probe. However, Vpk_Neg is a peak negative voltage only available on V-probe. The V-probe has two voltage detection outputs. One output is employed to detect the positive form of the waveform and the other output is employed to detect the negative form of the waveform. Similarly, Ipk_Pos is a positive current peak only available on VI-probe.

Referring to FIG. 9, the UUT_select enable signal 919 is also responsible for routing +24 V power 922 from control PCB 902 through first connector 906 to V or VI probe 930 in an embodiment. Similarly, +24 V power 922 is routed from control PCB 902 through second connector 908 to third switch (SW3) 938. Coaxial switch SW3 938, in the default position, is configured to route RF power from a coaxial switch SW2 940 to V-load network 928. RF buffered outputs from V or VI probe 930 is routed to RFVM 936.

Hence, in order to measure and/or calibrate RF voltages on V-probe or VI-probe 930, signals and +24 V power are routed through control PCB 902 relays 912 and 916. The relays 912 and 916 and coaxial switch SW3 938 are in the default position to route the signals and RF power to the probe 930. Over-voltage contact actuation is tested on the V-load and is sensed as a +5V pole-up contact detector 910. Digital output signal UUT_select 919 from computer I/O 920 determines which probe is to be tested.

In another example, digital output signal UUT_select 919 also determines the enable to test a VI-probe 926 for the I-load network 924. SPDT relays 912 and 916 switch to the alternate positions to route +24 V DC power 922 over to VI-probe 926 through connector 904. Similarly, the enable signal routes +24 V DC power 922 over to coaxial switch SW3 938 through connector 908. SW3 938 is selected to the alternate position to route RF power from SW2 940 to I-load 924. RF buffered outputs from VI probe 926 are routed to RFVM 934.

Hence, in order to measure and/or calibrate RF currents on VI-probe 926, signals and +24 V power are routed through control PCB 902 relays 912 and 916. The relays 912 and 916 and coaxial switch SW3 938 are in the alternate positron to route the signals and RF power to VI-probe 926. The current (I) reading may be provided back to control PCB 902 through the connector 904, so the signal may be processed through computer I/O 920.

As may be appreciated from the foregoing, embodiments of the invention provide methods and arrangements for measuring RF current in addition to voltage values to calibrate voltage and/or voltage-current probes. In addition, the probes may be calibrated to measure and control voltage and current within 1.5 percent traceable to NIST standards. Hence, high accuracy RF measurements during plasma processing may translate to better process control, which may allow the end user to make wafer or electronic components with finer features.

While this invention has been described in terms of several preferred embodiments, there are alterations, permutations, and equivalents, which fall within the scope of this invention. Also, the title, summary, and abstract are provided herein for convenience and should not be used to construe the scope of the claims herein. It should also be noted that there are many alternative ways of implementing the methods and apparatuses of the present invention. Although various examples are provided herein, it is intended that these examples be illustrative and not limiting with respect to the invention. Further, in this application, a set of "n" items refers zero or more items in the set. It is therefore intended that the following appended claims be interpreted as including all such alterations, permutations, and equivalents as fail within the hue spirit and scope of the present invention.

What is claimed is:

1. A diagnostic tool for performing electrical measurements to calibrate a plasma processing chamber probe, comprising:
    an RF generator;
    a first impedance circuit, said first impedance circuit is a voltage-load network, configured to deliver RF voltage outputs from said RF generator for voltage measurements when RF power from said RF generator is delivered to said first impedance circuit, wherein said RF voltage outputs are in the range of about 200 volts to about 6,100 volts;
    a second impedance circuit, said second impedance circuit is a current-load network, configured to deliver RF current outputs from said RF generator for current measurements when said RF power from said RF generator is delivered to said second impedance circuit, wherein said RF current outputs are in the range of about 2 amperes to about 50 amperes; and
    a coaxial switch network arrangement configured to provide switchable RF delivery paths to deliver said RF power from said RF generator to one of said first impedance circuit and said second impedance circuit.

2. The diagnostic tool of claim 1 further comprising:
    an RF voltage control arrangement, said RF voltage control arrangement configured to command said RF generator to output said RF power to match a predetermined software defined set point;
    a control PCB probe signal routing arrangement, said control PCB probe signal routing arrangement configured to allow electrical signals to be routed through one of said first impedance circuit and said second impedance circuit to measure electrical values from said probe; and
    a system interlock, said system interlock includes a control PCB interlock relay arrangement configured to prevent said diagnostic tool from delivering said RF power from said RF generator if at least one of predetermined conditions is met.

3. The diagnostic tool of claim 2, wherein said RF voltage control arrangement includes a data acquisition board.

4. The diagnostic tool of claim 2, wherein said RF voltage control arrangement is a closed-loop RF voltage control arrangement.

5. The diagnostic tool of claim 2, wherein said control PCB probe signal routing arrangement includes a plurality of single-pole double-throw relays.

6. The diagnostic tool of claim 2, wherein said control PCB probe signal routing arrangement includes a plurality of double-pole double-throw relays.

7. The diagnostic tool of claim 2, wherein said control PCB interlock relay arrangement includes an interlock relay.

8. The diagnostic tool of claim 2, wherein said control PCB interlock relay arrangement includes a voltage clamp circuit and a darlington circuit.

9. The diagnostic tool of claim 2, wherein said system interlock includes a voltage-load interlock switch and a current-load interlock switch.

10. The diagnostic tool of claim 2, wherein said system interlock includes a plurality of leak detection switches.

11. The diagnostic tool of claim 2, wherein said system interlock includes a flow switch and a water valve.

12. The diagnostic tool of claim 1, wherein said RF generator is a 50 Ohm generator.

13. The diagnostic tool of claim 1, wherein said voltage-load network is tuned to match an impedance of said RF generator.

14. The diagnostic tool of claim 1, wherein said current-load network is tuned to match an impedance of said RF generator.

15. The diagnostic tool of claim 1, wherein said current-load network is tuned to resonate at about 13.56 MHz.

16. The diagnostic tool of claim 1, wherein said coaxial switch network arrangement includes an attenuator.

17. A method for performing electrical measurements to calibrate a plasma processing chamber probe, comprising:
providing an RF generator that is configured to output a RF power signal;
providing a first impedance circuit, said first impedance circuit is a voltage-load network being configured to deliver RF voltage outputs from said RF generator for voltage measurements when RF power from said RF generator is delivered to said first impedance circuit, wherein said RF voltage outputs are in the range of about 200 volts to about 6,100 volts;
providing a second impedance circuit, said second impedance circuit is a current-load network that is configured to deliver RF current outputs from said RF generator for current measurements when said RF power from said RF generator is delivered to said second impedance circuit wherein said RF current outputs are in the range of about 2 amperes to about 50 amperes; and
providing a coaxial switch network arrangement that is configured to implement switchable RF delivery paths to deliver said RF power from said RF generator to one of said first impedance circuit and said second impedance circuit.

18. The method of claim 17 further comprising:
configuring an RF voltage control arrangement, said RF voltage control arrangement to command said RF generator to output said RF power to match a predetermined software defined set point;
configuring a control PCB probe signal routing arrangement, said control PCB probe signal routing arrangement to allow electrical signals to be routed through one of said first impedance circuit and said second impedance circuit to measure electrical values from a probe; and
configuring a system interlock, said system interlock includes a control PCB interlock relay arrangement to prevent said method from delivering said RF power from said RF generator if at least one of predetermined conditions is met.

19. The method of claim 18, wherein said RF voltage control arrangement includes a data acquisition board.

20. The method of claim 18, wherein said RF voltage control arrangement is a closed-loop RF voltage control arrangement.

21. The method of claim 18, wherein said control PCB probe signal routing arrangement includes a plurality of single-pole double-throw relays.

22. The method of claim 18, wherein said control PCB probe signal routing arrangement includes a plurality of double-pole double-throw relays.

23. The method of claim 18, wherein said control PCB interlock relay arrangement includes an interlock relay.

24. The method of claim 18, wherein said control PCB interlock relay arrangement includes a voltage clamp circuit and darlington circuit.

25. The method of claim 18, wherein said system interlock includes a voltage-load interlock switch and a current-load interlock switch.

26. The method of claim 18, wherein said system interlock includes a plurality of leak detection switches.

27. The method of claim 18, wherein said system interlock includes a flow switch and a water valve.

28. The method of claim 17, wherein said RF generator is a 50 Ohm generator.

29. The method of claim 17, wherein said voltage-load network is tuned to match an impedance of said RF generator.

30. The method of claim 17, wherein said current-load network is tuned to match an impedance of said RF generator.

31. The method of claim 17, wherein said current-load network is tuned to resonate at about 13.56 MHz.

32. The method of claim 17, wherein said coaxial switch network arrangement includes an attenuator.

* * * * *